United States Patent [19]

Sloane

[11] Patent Number: 4,813,001
[45] Date of Patent: Mar. 14, 1989

[54] AC CALIBRATION METHOD AND DEVICE BY DETERMINING TRANSFER CHARACTERISTICS

[75] Inventor: Edwin A. Sloane, Los Altos, Calif.

[73] Assignee: Schlumberger Systems, Inc., Sunnyvale, Calif.

[21] Appl. No.: 55,670

[22] Filed: May 29, 1987

[51] Int. Cl.$^4$ .............................................. G06F 11/00
[52] U.S. Cl. ........................................ 364/553; 371/24
[58] Field of Search .............. 364/553, 725, 726, 727, 364/826; 371/15, 24; 340/347 R, 347 M; 367/13; 324/77 R, 57 PS

[56] References Cited

U.S. PATENT DOCUMENTS

| | | | |
|---|---|---|---|
| 3,393,301 | 7/1968 | Valstar | 364/553 |
| 3,526,761 | 9/1970 | Smith | 364/553 |
| 3,526,832 | 9/1970 | Post | 364/553 X |
| 4,315,319 | 2/1982 | White | 364/553 X |
| 4,335,373 | 6/1982 | Sloane | 340/347 CC |
| 4,352,160 | 9/1982 | Frech et al. | 364/553 |
| 4,673,917 | 6/1987 | Urschel et al. | 364/727 X |

OTHER PUBLICATIONS

"A General Method For Increasing Converter Accuracy and Resolution," a paper by E. A. Sloane and P. W. Dodd, presented to the ITC, Oct. 18–20, 1983.
Abstract and Summary For a Paper Entitled "A General Method For Increasing Converter Accuracy and Resolution," by E. A. Sloane and P. W. Dodd, dated 3/9/83.

*Primary Examiner*—Bentsu Ro
*Attorney, Agent, or Firm*—Theodore S. Park; Robert C. Colwell; Jonathan A. Small

[57] ABSTRACT

A method for determining the transfer function of a data acquisition system involves inputting a set of bi-level input test patterns to the system and measuring the system's response. The input test patterns from a complete orthogonal set. The input test patterns or the system's response can be weighted to correct for aliasing error and/or to represent any arbitrary input waveform. From the ratio of the Fourier transform of the sum of the responses to the Fourier transform of the sum of the input test patterns the transfer function is derived. In operation, the transfer function is used to accurately determine the characteristics of any input waveform to the system.

22 Claims, 8 Drawing Sheets

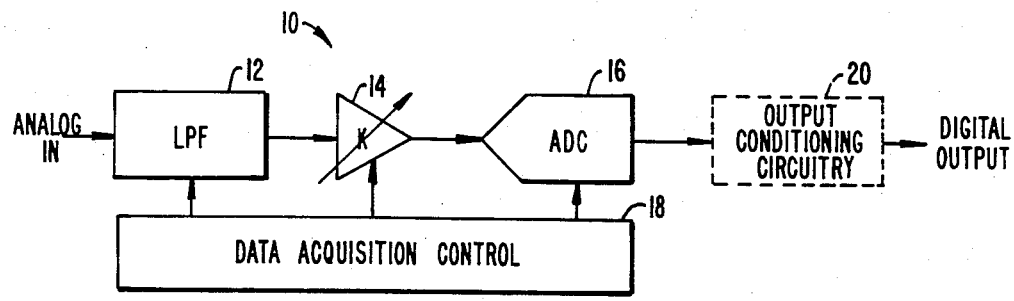
FIG._1.
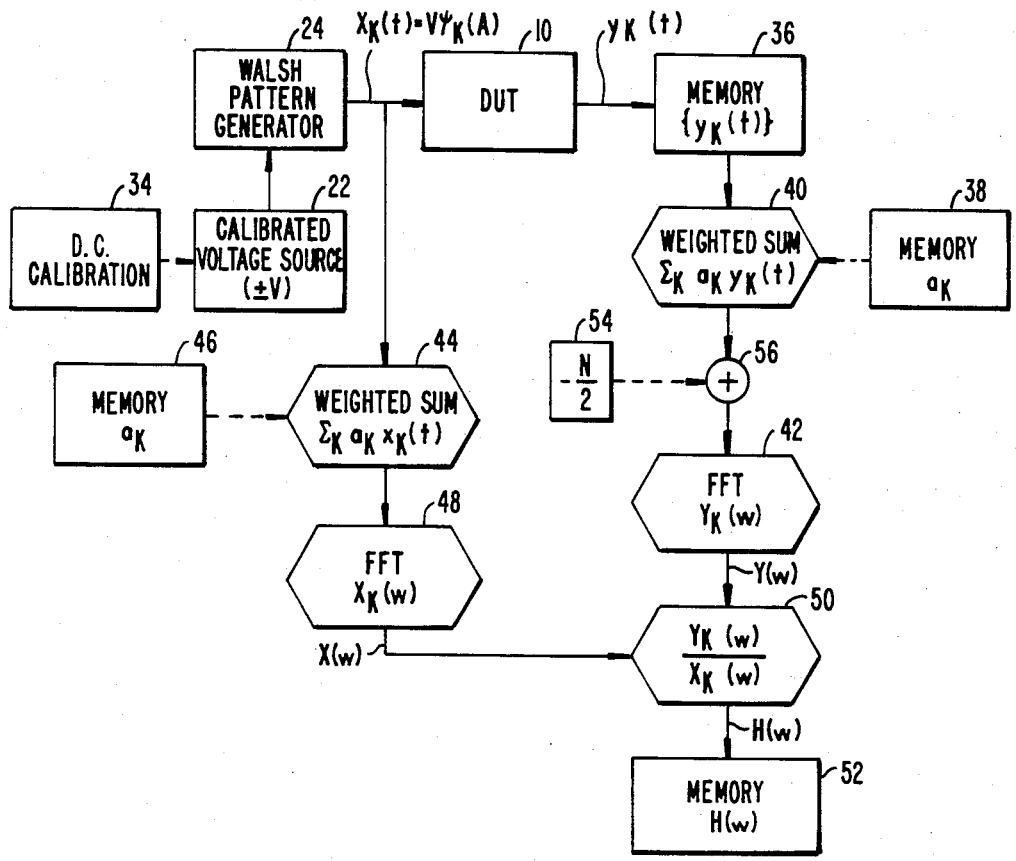
FIG._2.

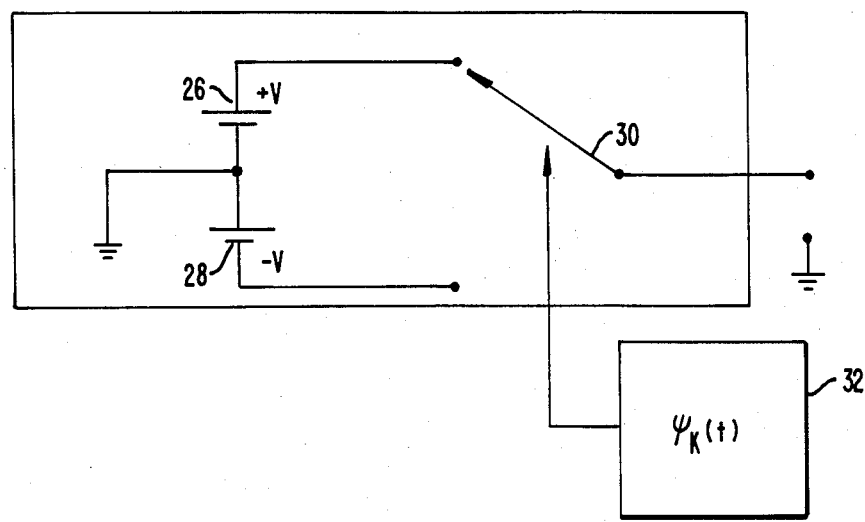
FIG._3.
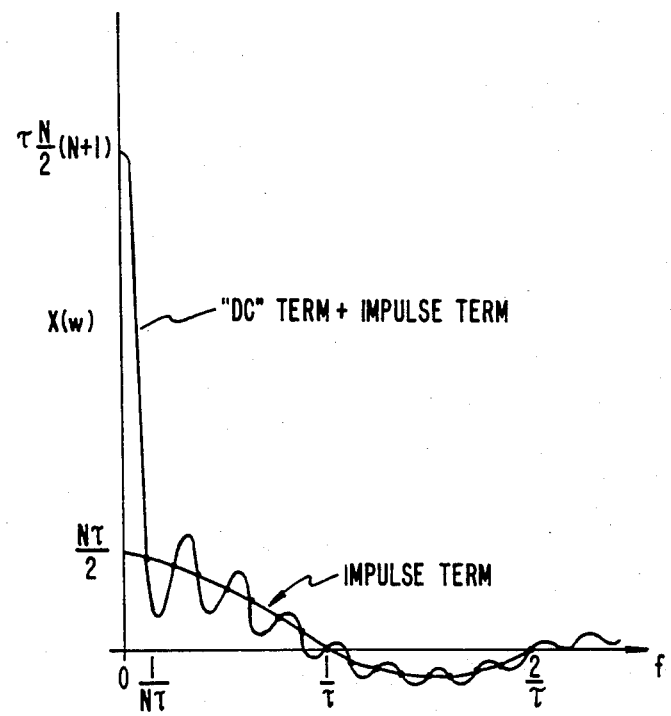
FIG._10.

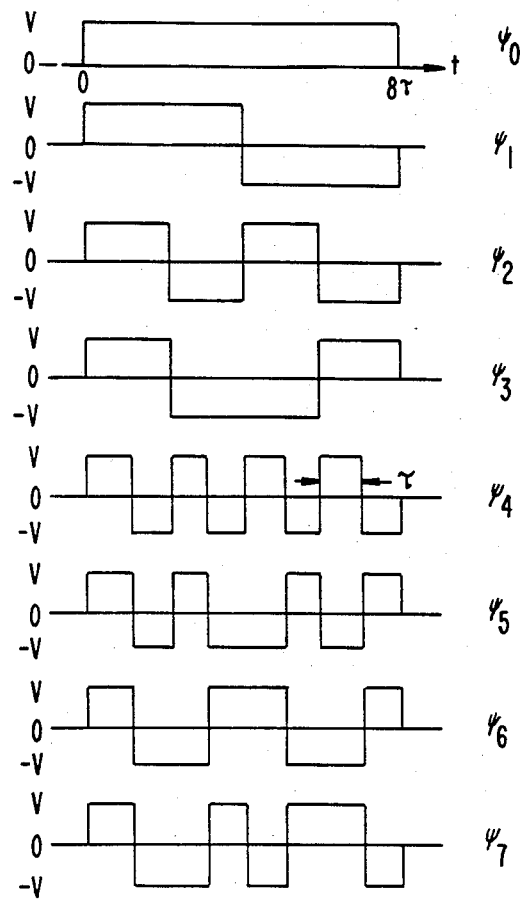
FIG._4.
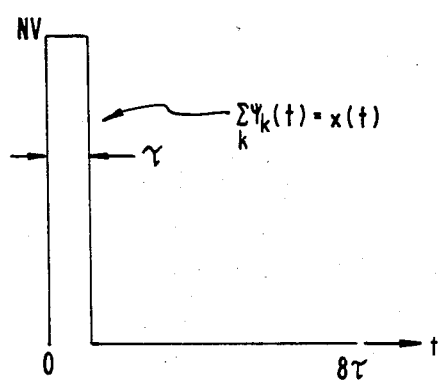
FIG._5.

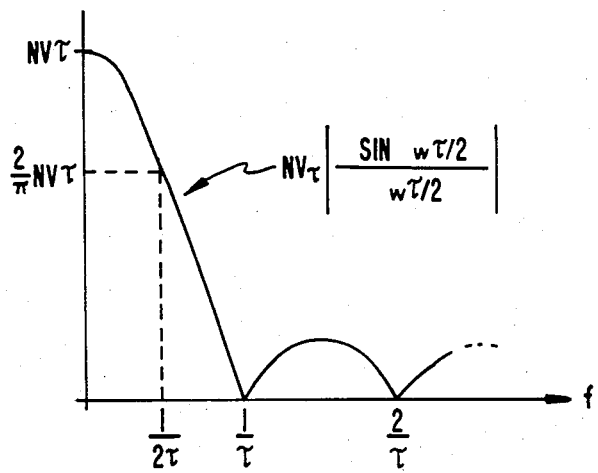
FIG._6.
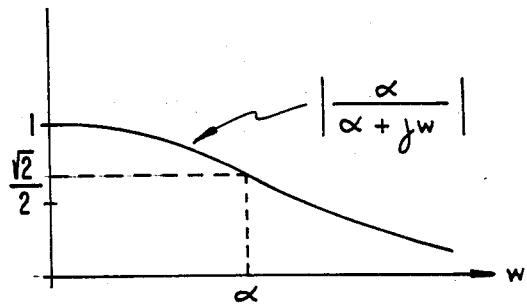
FIG._7.

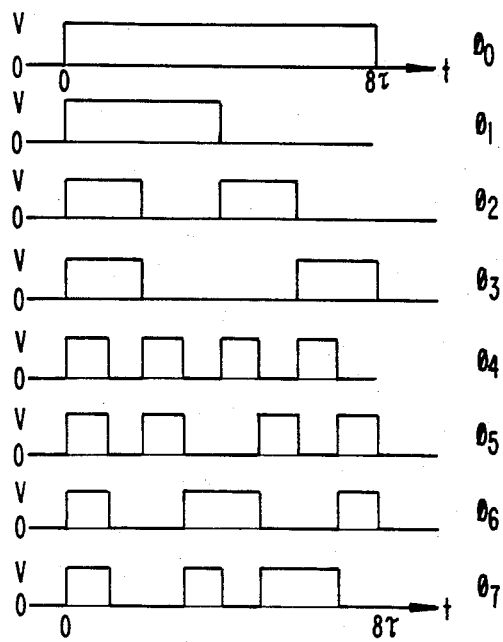
FIG._8.
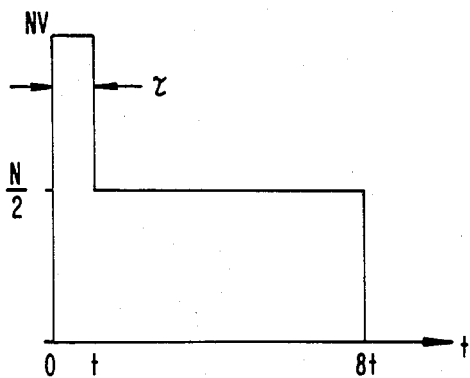
FIG._9.

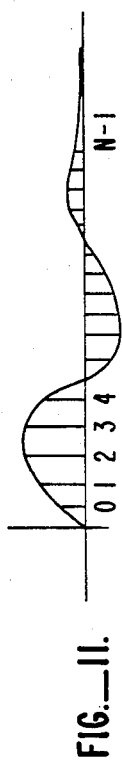
FIG.—11.
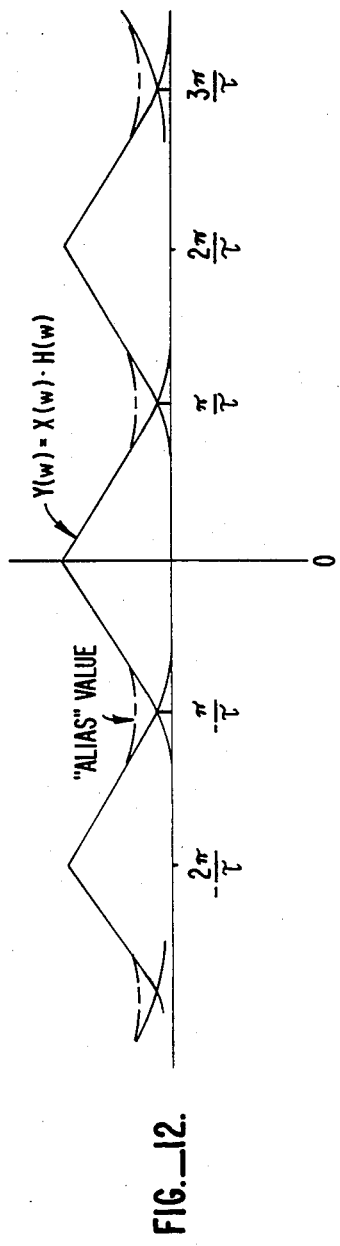
FIG.—12.
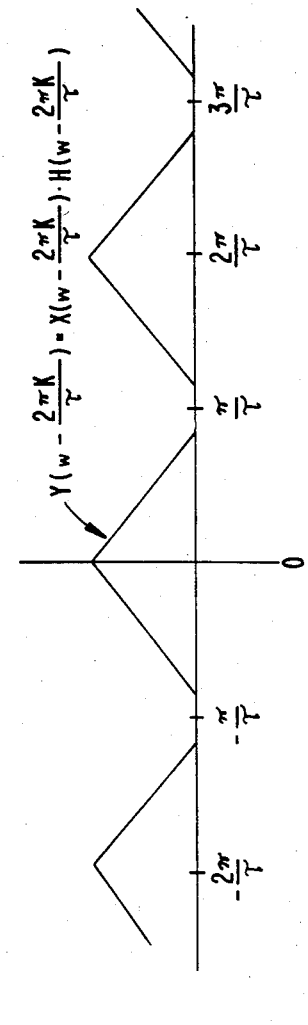
FIG.—13.

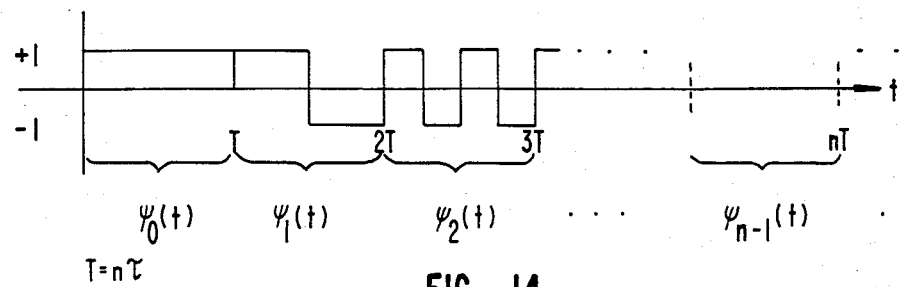
FIG._14.
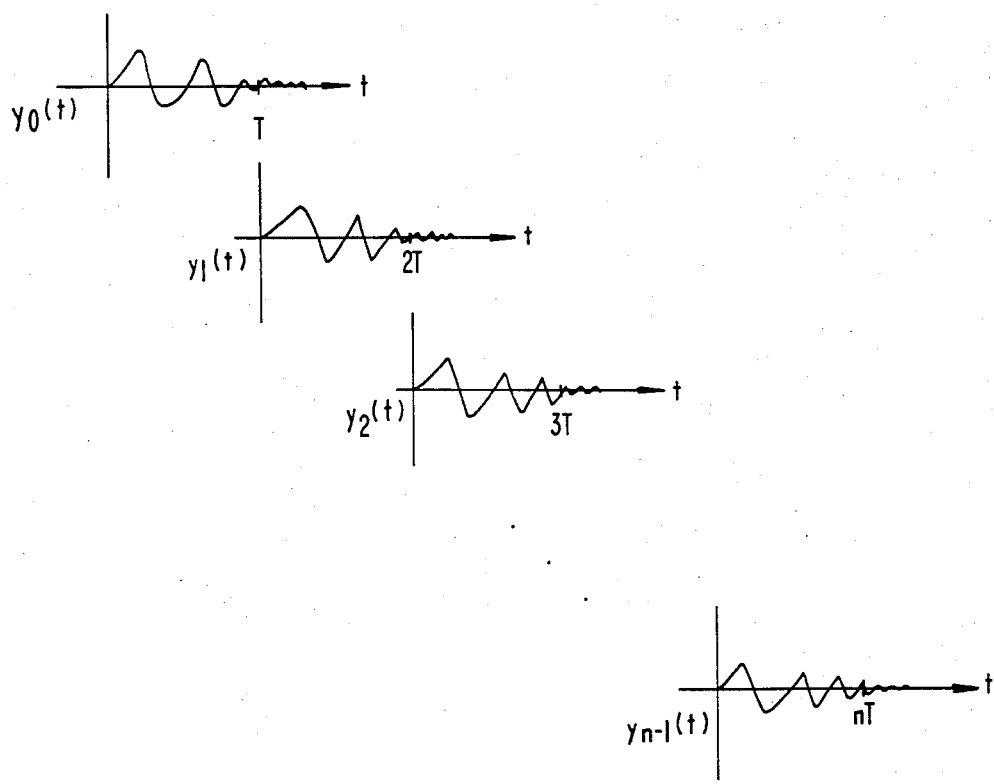
FIG._15.

AC CALIBRATION METHOD AND DEVICE BY DETERMINING TRANSFER CHARACTERISTICS

BACKGROUND OF THE INVENTION

1. Field of the Invention

The present invention relates generally to the field of data acquisition and signal processing systems, and more particularly to AC calibration methods which account for a system's transfer chacteristics by utilizing bilevel signal patterns as test signals for determining the system's transfer function.

2. Description of the Prior Art

Typically, a data acquisition system (DAS) is composed of one or more analog input channels, an analog-to-digital converter (ADC), arithmetic, amplification, and filter systems (referred to as processing systems), and either digital outputs or a digital-to-analog converter (DAC) and analog outputs. AC calibration of the system is required to account for the transfer characteristics of the ADC, processing systems and/or DAC, i.e., the system's response to particular inputs. Only an initial AC calibration of the DAS is performed, and for most systems, generalized transfer functions can be derived for any arbitrary input waveform.

Typically, AC calibration of a DAS involves parallel computation of calibration coefficients by simultaneously observing both the stimulus and response for the system. The calibration adjustment may be either post-processing or, by feedback loop, pre-processing to the DAS.

It is assumed that systems of the type under concern are approximately linear. The input and output of such a system is related by a linear differential equation with constant coefficients, for example:

$$a_0 y(t) + a_1 \frac{dy}{dt} + \ldots = b_0 x(t) + b_1 \frac{dx}{dt} + \ldots,$$

where $a_0, a_1, \ldots b_0, b_1, \ldots$ are constants.

The frequency transfer function, $H(\omega)$, for this system is defined as:

$$H(\omega) = \frac{\Sigma_s b_s (j\omega)^s}{\Sigma_r a_r (j\omega)^r} = \frac{Y(\omega)}{X(\omega)},$$

where $X(\omega)$ is the Fourier transform of the input function $x(t)$, and $Y(\omega)$ is the Fourier transform of the response function $y(t)$.

Thus, a common method for testing the DAS is to apply to the input(s) of the DAS a sinusoidal pattern. The output will be a second sinusoid having a different amplitude, and usually a different phase, but the same frequency, as the input sinusoid. The above ratio then yields values in terms of amplitude and phase of the system frequency transfer function at that frequency. This data can then be used to generate a correction coefficient vector for the signal processing system. Thus, determining the frequency transfer function for a system is an integral step in AC calibration of that system.

Correction coefficients can be determined by the method detailed above only one frequency at a time. This process is slow, limits exact correction to those frequencies tested, thereby producing only approximate correction for other frequencies in the bandwidth, and is subject to the added errors of inaccuracy of frequency selection devices.

A modified approach utilizing this principal is to apply an impulse, such as a delta function, to the system. The width of the impulse, $\tau$, of a true delta function is vanishingly small. This implies that the impulse must have a very large amplitude in order to generate sufficient response energy to maintain a high signal to noise ratio. The practical limits on generating such an impulse, including rise and decay times of the signal generator, maximum input range of the system, etc., yields generating and/or utilizing such an actual impulse impracticable.

There is a present need in the art for a broadband method of determining the absolute frequency transfer function of a signal processing system for AC signals and AC signals having DC components which is faster and more independent of other device errors than the presently existing methods.

SUMMARY OF THE INVENTION

The present invention provides a method of accurately determining the frequency transfer function of a linear or nearly linear signal processing system for any arbitrary input waveform. The method minimizes aliasing which may arise from the wideband nature of the functions used to generate the input calibration signals to the device.

The present method involves inputting a set of test patterns, one at a time, to a data acquisition system (DAS). In one embodiment, a complete orthogonal set of test patterns is chosen which is capable of representing any continuous bounded input function desired. Further, bilevel patterns are utilized due to their ease and accuracy of generation.

According to one aspect of the invention, the set of patterns chosen are such that their sum approximates a delta function. If a proper set of such patterns is chosen, an approximate delta function having sufficient energy to obtain a response from the DAS, while requiring minimum peak amplitude, may be obtained. One such set is that generated by the Welsh functions of order N, where $N = 2^m$, m a positive integer.

The vector sum of the input patterns is calculated and stored in memory. The frequency domain transform of that vector sum is then calculated and stored in memory.

The response of the DAS to each individual test pattern is then acquired. The responses are summed, the frequency domain transform of the sum calculated, and the transform stored in memory. Alternatively, the frequency domain transform of each response may be calculated, the transforms summd, and the sum stored in memory.

A ratio is formed of the frequency domain transform of the sum of the responses (corresponding to the output frequency function) to the frequency domain transform of the sum of the input patterns (corresponding to the input frequency function). This ratio is the transfer function vector which corresponds to the frequency gain and phase shift at each frequency of concern. Its reciprocal is the correction coefficient vector. Either or both of these vectors are stored in memory.

Rapid calculation of the correction coefficient vector may be made by concatenating the input test patterns, and sampling the output in synchronization with the input.

Correction for aliasing error is made by using weighted values of the input test patterns to represent an appropriate bandwidth limited input function. Examples of such weighting values include the Kaiser-Bessel window function and prolate-spheroidal functions. Due to the linearituy of the DAS, the weighting factors may be applied at the output of the DAS. This provides the advantage that the weighted sum of the input patterns can readily approximate any arbitrary function, including specifically a delta function, and that only bilevel calibrated input patterns (absolute calibration) are needed.

These features, as well as others, will become more readily apparent from the following detailed description of the preferred embodiment when taken in conjunction with the illustrative embodiment in the accompanying drawings.

BRIEF DESCRIPTION OF THE DRAWINGS

FIG. 1 is a block diagram of a typical device under test (DUT) for which calibration according to the present invention is made.

FIG. 2 is a block diagram of a method for determining the frequency transfer function for a data acquisition system according to the present invention.

FIG. 3 shows details of an apparatus for generating bilevel signal patterns.

FIG. 4 shows a set of Walsh patterns of rank N=8.

FIG. 5 shows a sum of Walsh patterns of rank N=8, of height VN and width $\tau$, approximating a delta function.

FIG. 6 shows a graph of the magnitude of the frequency input function $X(\omega)$.

FIG. 7 shows a graph of the magnitude of the frequency transfer function $|H(\omega)|$.

FIG. 8 shows an offset Walsh patterns of rank N=8.

FIG. 9 shows a sum of offset Walsh patterns of rank N=8, approximating a delta function with an offset of N/2.

FIG. 10 shows a graph of the impulse and DC terms of the frequency function response to a set of offset Walsh patterns.

FIG. 11 shows a time-domain response to a typical unweighted input test pattern.

FIG. 12 shows a frequency-domain response to a typical unweighted input test pattern.

FIG. 13 shows a frequency-domain response to a weighted input test pattern.

FIG. 14 shows a partial concatenated stream of Walsh patterns forming a typical input to a data acquisition system according to one embodiment of the present invention.

FIG. 15 shows a series of responses of a data acquisition system to a concatenated stream of inputs, illustrating the truncating of sampling the responses according to one embodiment of the present invention.

DETAILED DESCRIPTION OF THE PREFERRED EMBODIMENT

Referring to the block diagram of FIG. 1, the typical elements of a data acquisition system (DAS) are shown. Those elements include include one or more low-pass filter 12, amplifier circuitry 14, analog to digital converters 16, and data acquisition control circuitry 18. Optionally, output conditioning circuitry 20 may be included.

In operation, an analog input signal is introduced to DAS 10. DAS 10 contains those devices for which calibration is required. Thus, DAS 10 is referred to as the device under test (DUT). The response of DUT 10, preferably in digital form, is then calibrated for its frequency transfer function, $H(\omega)$.

The calibrated response of DUT 10 may be conditioned for output by output conditioning circuitry 20, such as a DAC, amplifier, etc., or may be passed on for further processing.

Referring to FIG. 2, a block diagram of a method for determining the frequency transfer function of DUT 10 are shown. In operation, a reference voltage (V) provided by calibrated voltage source 22 is input to Walsh pattern generator 24. One method of generating Walsh patterns is discussed in detail by Peterson, GENERATION OF WALSH FUNCTIONS, from "Applications of Walsh Functions Symposium and Workshop," 1970 proceedings, edited by C. A. Bass. Apparatus for generation of such patterns is shown in FIG. 3. Such an apparatus consists of calibrated voltage sources 26 (+V) and 28 (−V), switch 30 and switch-state controller (preferably a memory device containing values corresponding to each Walsh function $\Psi_k(t)$) 32. In operation, switch-state controller 32 completes a circuit including either voltage source 26 (+V), or 28 (−V), corresponding to the bilevel states of Walsh function $\Psi_k(t)$. One advantage of using bilevel test signals, such as the Walsh function patterns, is that to obtain a calibrated set of such patterns only two state DC calibration (absolute calibration) is required. Thus, DC levels of the Walsh patterns generated by Walsh pattern generator 24 may be calibrated by DC calibration device 34 (returning to FIG. 2) prior to calibration of DUT 10.

Consider the binary valued (±V) Walsh patterns, of rank 8 (N=8), as shown in FIG. 4. For a discussion of the general nature of such functions see, Corrington, ADVANCED ANALYTICAL AND SIGNAL PROCESSING TECHNIQUES, ASTIA doc. no. AD277942, (1962). The sum of these patterns, $$x(t) = V \sum_{k=0}^{N-1} \psi_k(t) \simeq VN \cdot \delta(t),$$

is an approximate delta function of height VN, as shown in FIG. 5. It approximates a delta function because of its finite width. If the maximum switching rate is $1/\tau$ (i.e., $\tau$ is the minimum switching period), then the Fourier transform of x(t) is:

$$X(\omega) = VN \int_0^\tau e^{-j\omega t'} dt',$$

or, $$X(\omega) = VN\tau \cdot \frac{\sin(\omega\tau/2)}{(\omega\tau/2)} \cdot e^{-j\omega\tau/2}.$$

The magnitude of the frequency function, $X(\omega)$, is plotted in FIG. 6. This is a broad-band signal down by 3.9 dB at $f=1/(2\tau)$.

Thus, if a linear system were to be excited by applying a complete set of Walsh functions sequentially, and the separate responses were summed, the sum would correspond to the response of the system to the function $$x(t) = V \sum_{k=0}^{N-1} \psi_k(t).$$

Thus, a function is provided having a large amount of energy with minimum peak amplitude and excellently distributed (almost uniform) frequency for $f < 1/(2\tau)$.

By maintaining the peak to peak level of the Walsh patterns relatively constant, preferably at $\pm V$, these patterns can form a basis for AC calibration of DUT 10. Thus, by applying the Walsh patterns to DUT 10, its frequency response function, $Y(\omega)$, may be derived. From this, the frequency transfer function. $H(\omega)$, can be obtained.

Therefore, the output of Walsh pattern generator 24 is applied to DUT 10, one pattern at a time. The individual responses, $y_k(t)$, are stored in memory 36 and, together with weighting values, $a_k$, stored in memory 38, the weighted sum $$\sum_{k=0}^{N-1} a_k y_k(t)$$

may be formed by device 40. The Fourier transform of the summed responses of DUT 10 is then calculated by, for example, FFT device 42. Alternatively, the Fourier transform of each response, $Y_k(\omega)$, may be calculated and then formed into the sum $$\sum_{-\infty}^{+\infty} Y_k(\omega)$$

It is necessary to calculate the Fourier transform of the input patterns. The sum of these transforms comprise part of the ratio used to determine the frequency transfer function. Because, $$\Sigma_k \text{ Fourier } \{\Psi_k(t)\} = \text{Fourier } \{\Sigma_k \Psi_k(t)\},$$

the output of Walsh pattern generator 24 is applied to summing device 44 which utilizes weighting values, $a_k$, stored in memory 46 to form the weighed sum $$\sum_{K=0}^{N-1} a_k x_k(t).$$

The sum of the Walsh patterns is then transformed to the frequency domain by FFT 48.

By definition, $$H(\omega) = \frac{Y(\omega)}{X(\omega)},$$

where, $Y(\omega)$ is the output function, and $X(\omega)$ is the frequency input test pattern. Thus, given the output function, and the frequency input function, both measurable quantities, the frequency transfer function can be determined.

The frequency input function, as previously discussed, is of the form:

$$X(\omega) = VN\tau \cdot \frac{\sin(\omega\tau/2)}{(\omega\tau/2)} \cdot e^{-j\omega\tau/2}.$$

Since accurate values of $\pm V$ may be measured, the order of the Walsh functions, N, is known, as is the minimum switching period, $\tau$, the "scaling factor" $NV\tau$ can be calculated and hence the calibration for the input is "absolute."

Thus, by taking the ratio of the Fourier transform of the sum of response signals to the Fourier transform of the sum of the input signals to DUT 10 in device 50, the frequency transfer function, H(w), is acquired. This result is stored in memory 52 for use in providing correction of DUT 10 in operation.

It should be noted that in the practical case, distributed capacitance (and possibly inductance) will "round" the "square" corners of the ideal Walsh patterns, which is equivalent to saying that the waveform of Walsh patterns have been filtered by a low pass network. Therefore, the network will see a frequency spectrum corresponding to $X_f(\omega)$, $$X_f(\omega) = X(\omega) \cdot H_f(\omega),$$

where $H_f(\omega)$ is the lowpass filter frequency transfer function.

If $H_f(\omega)$ corresponds to a single pole RC network, with a pole at $\alpha$, then $$X_f(\omega) = X(\omega) \cdot \frac{\alpha}{\alpha + j\omega},$$

or $$H_f(\omega) = \frac{\alpha}{\alpha + j\omega}.$$

This frequency transfer function, $H_f(\omega)$, is plotted in FIG. 7. Its magnitude is $$|H_f(\omega)| = \frac{1}{\sqrt{1 + (\omega/\alpha)^2}}.$$

For $|\omega/\alpha| << 1$, $$|H_f(\omega)| = \frac{1}{1 + 2(\omega/\alpha)^2} = 1 - 2(\omega/\alpha)^2 + 4(\omega/\alpha)^4 - \dots.$$

or $$|H_f(\omega)| \approx 1 - 2(\omega/\alpha)^2.$$

The second term is the frequency gain error due to the distributed reactance, and is referred to as $\epsilon$, $$\epsilon = 2(\omega/\alpha)^2.$$

The value of $\epsilon$ is the error tolerance which is specified by the user. The value of $\epsilon$ determines the bandwidth of effective calibration for the method according to the present invention. In order to specify the bandwidth, the immediately preceding equation is solved for $\omega$, $$\omega_{max} = \alpha \sqrt{\epsilon/2},$$

or $$f_{max} = \frac{\omega_{max}}{2\pi} = (\alpha/2\pi)(\sqrt{\epsilon/2}).$$

This value represents the maximum frequency for which a bilevel calibration, alone, is effective. That is, beyond $f_{max}$, calibration for other than the DC levels of the test patterns is required in order to determine the frequency transfer function, $H(\omega)$.

For example, a step function generator has been developed by the National Bureau of Standards that has a rise time (10% to 90%) of 5–6 nanoseconds. See, Souders, et al., DYNAMIC CALIBRATION OF WAVEFORM RECORDERS USING A PRECISION PRO- GRAMMABLE STEP GENERATOR, from "Electronic Instrumentation and Methodology," Electrosystems Div., N.B.S., Gaithersburg, MD. This corresponds to $3.66 \times 10^8 < \alpha < 4.39 \times 10^8$. Thus, if $\epsilon = 10^{-3}$, the rangeof f is from 1.30 to 1.56 Mhz. Thus, for this bandwidth only DC calibration would be required to ensure proper peak to peak levels of the bilevel signal in order to provide calibration of DUT 10.

It is possible to perform calibration of DUT 10 using a modified set of Walsh patterns such that the levels of the individual patterns are zero and non-zero, respectively. This is as opposed to the previous discussion where it was assumed that the levels of the individual patterns were non-zero.

Assume V is equal to +1 volt. We can define the set of test patterns to be $$\Phi_k(t) = (\tfrac{1}{2})[\Psi_k(t) + \Psi_0(t)]$$

as shown if FIG. 8. And $$x(t) = \sum_{k=0}^{N-1} \phi_k(t) = (\tfrac{1}{2}) \sum_{k=0}^{N-1} \psi_k(t) + (\tfrac{1}{2}) \sum_{k=0}^{N-1} \psi_0(t)$$

or $$x(t) = (N/2) \cdot \delta(t) + (N/2) \cdot \psi_0(t)$$

as shown in FIG. 9.

The corresponding transform is $$X(\omega) = (N/2) \int_0^T e^{-j\omega t}\, dt + (N/2) \int_0^{N\tau} e^{-j\omega t}\, dt$$

so that $$X(\omega) = N \frac{\sin \omega \tau/2}{\omega} \cdot e^{-j\omega t/2} + N \frac{\sin N\omega\tau/2}{\omega} \cdot e^{-Nj\omega\tau/2}$$

The first term on the right of the abaove equation is the "impulse" and the second term is the "DC" term due to the offset N/2. This is plotted in FIG. 10.

Practically, the very large "DC" value due to the offset is $$\left.\frac{N \sin N\omega\tau/2}{\omega}\right|_{\omega=0} = N^2\tau/2,$$

while the value of the "impulse" term at $\omega = 0$ is $$\left.\frac{N \sin \omega\tau/2}{\omega}\right|_{\omega=0} = N\tau/2.$$

The "impulse" term is thus a factor of N less than the "DC" term. This may cause severe dynamic range problems in the FFT algorithm of device 42. As a result, if offset Walsh patterns are used, the "DC" term may be removed (or reduce) before application of the FFT algorithm. This operation involves subtracting N/2, using memory 54 holding $-N/2$, and adder 56, from the measured response.

Ideal Walsh functions have infinite bandwidth and some weighted sums may also exhibit infinite bandwidth, such as the sum of uniformly weighted Walsh functions that result in the approximate delta function, which has a spectrum that falls off at only 6 dB per octave. Aliasing will occur whenever the analog system preceding the ADC fails to limit the spectral energy to less than one-half the sampling rate of the ADC.

Spectral shaping of the calibration signal could be accomplished by using an appropriately weighted sum of bilevel functions, such as weighted Walsh functions. That is, if the set of bilevel functions chosen form a complete orthogonal set, virtually any function may be synthesized. Preferred weights for aliasing representation include the Kaiser-Bessel window function, or the weights of the prolate-spheroidal functions. The Kaiser-Bessel window function is further discussed in Kaiser, NON-RECURSIVE DIGITAL FILTER DESIGN USING THE $I_o$—SINH WINDOW FUNCTION, from "Digital Signal Processing, II," IEEE Press, 1976. Focusing on the Walsh functions, let x(t) represent an approximately bandwidth limited function such that $$x(t) = \Sigma_k[a_k \cdot \Psi_k(t)].$$

If this function is used for calibration, the output of the linear analog system, in front of the ADC, is $$y(t) = \Sigma_k[a_k \cdot \Psi_k(t)] * h(t),$$

where * represents the convolution of the functions, and where h(t) is the impulse response of the system (DUT) to be calibrated. But $$y_k(t) = \Psi_k(t) * h(t),$$

which is the system's response to the unweighted Walsh function $\Psi_k(t)$, so that $$y(t) = \Sigma_k[a_k \cdot y_k(t)].$$

This implies that the response function, y(t), could be obtained by forming a weighted sum of the individual responses that would result from a calibration signal consisting of a sequence of unweighted Walsh functions.

If an approximately bandwidth limited function were to be sampled at an appropriate sampling rate $$f_s = 1/\tau,$$

then the sampled values, $y(n\tau)$, could be represented as $$y(n\tau) = \Sigma_k a_k \cdot y_k(n\tau).$$

This further implies that the weights $\{a_k\}$ could be applied to the sampled unweighted responses $\{y_k(n\tau)\}$.

The set of weights $\{a_k\}$ may represent any arbitrary function, including an aribtrary scaling constant corresponding to a uniformly weighted set.

In implementation, the weights could be applied after the ADC, but before circularization, discussed further below.

Weighted Walsh functions may be used to reducing the effects of aliasing. Aliasing is of concern when the sampling frequency is smaller than $\pi/\tau$. Response to input test patterns in such a case is shown in FIG. 11, and its plot in the frequency domain is shown in FIG. 12. The effect of aliasing can be avoided by using weighted input functions, corresponding to weighted output functions as follows $$y(k) \cdot \sum_{n=0}^{\infty} \delta(t - n\tau),$$

or, in the frequency domain $$\frac{1}{\tau} Y(\omega) * \sum_{k=-\infty}^{+\infty} \delta\left(\omega - \frac{2\pi k}{\tau}\right) =$$

$$\frac{1}{\tau} [X(\omega)H(\omega)] * \sum_{k=-\infty}^{+\infty} \delta\left(\omega - \frac{2\pi k}{\tau}\right),$$

the convolution reducing to $$Y\left(\omega - \frac{2\pi k}{\tau}\right) = X\left(\omega - \frac{2\pi k}{\tau}\right) \cdot H\left(\omega - \frac{2\pi k}{\tau}\right).$$

As can be seen in FIG. 13, aliaasing error is avoided.

A second distinct application of weighted functions is the ability to simulate arbitrary stimuli and responses thereto. Thus, for example, in applications constrained to sinusoidal inputs to the data acquisition system, a calibration using a sinusoidal test stimulus may be acquired.

In one embodiment of the present invention, the input test patterns are input in a concatenated stream, as detailed in FIG. 14. See, Sloane, TRANSFER FUNCTION ESTIMATION, "1984 International Test Conference Proceedings," Oct. 16–18, 1984, IEEE. To minimize error in summation of responses over the sampling spectrum due to truncating the terminal transients of the responses of DUT 10 to the individual input test patterns of the stream, as shown in FIG. 15, the responses may be stored in a circular fashion, i.e., summing the nth truncated sample with the sum of each of the previous n-1th samples. The width of the sampling period for each response is uniformly limited to the pattern period T, equal to N$\tau$, $\tau$ being the minimum switching period. In this fashion sampling error in the form of accumulated responses beyond the sampling period is minimized.

Complete implementation of the above-described embodiment can be made using the Series 80 Analog Test System, manufactured by Sentry Division, Schlumberger Systems, Schlumberger Ltd. The Series 80 contains Audio Force and Measure Generator stimulus and probe boards capable of: generating a complete set of rank N calibrated (absolute) Walsh function patterns; measuring the response of a DUT to the patterns; summing the patterns; calculating the Fourier transform of the sum of the patterns and of the individual responses of the DUT to the patterns; summing the patterns; and calculating the quotient of the sum of the transform of the responses to the transform of the sum of the patterns.

Walsh patterns are chosen as a preferred method of implementing the present invention, although there are other sets of functions that would achieve equivalent ends. For example, a modified set of Walsh functions, wherein selected columns of the matrix of values for the Walsh patterns are transposed, operate to produce the same results. Thus, reference to Walsh functions is illustrative, and not limiting, throughout.

In general, to those skilled in the art to which this invention relates, many changes in construction and widely differing embodiments and applications of the present invention will suggest themselves without departing from its spirit and scope. For example, AC calibration corrections may be accomplished in the time domain by calculating the inverse Fourier transform of the frequency transfer function once it is calculated. Further, calibration corrections may be made by altering the values of the components of the DUT. Further still, the frequency transfer function may be updated by recursive calculations during operatin of the DUT. Thus the disclosures and descriptions hereinare purely illustrative and are no intended to be in any sense limiting.

What is claimed is:

1. A method for determining a broad-band transfer function of a data acquisition system, comprising the steps of:
    generating a set of bilevel signal patterns;
    applying said signal patterns individually to the data acquisition system;
    obtaining a response of the data acquisition system to each said signal pattern; and
    computing said transfer function from said responses.

2. A method for determining a broad-band transfer function of a data acquisition system, comprising the steps of:
    generating a set of bilevel signal patterns;
    applying said signal patterns individually to the data acquisition system;
    obtaining a response of the data acquisition system to each said signal pattern;
    weighting said responses of the data acquisition system with weighting coefficients; and
    computing said transfer function from said weighted responses.

3. A method for determining a broad-band transfer function of a data acquisition device, and correcting the data acquisition device for the transfer function, comprising the steps of:
    generating a set of bilevel signal patterns;
    exciting said data acquisition device with said signal patterns;
    obtaining an actual response of the data acquisition device to each said signal pattern;
    weighting said responses of the data acquisition device with weighting coefficients;
    computing said transfer function from said responses; and
    correcting the signal processing device with said transfer function.

4. A method for determining a frequency transfer function of a data acquisition device, and correcting the data acquisition device for the frequency transfer function, comprising the steps of:
    providing a voltage source and switch system capable of generating a set of complete orthogonal functions;
    generating a test signal pattern from said complete orthogonal set of functions;
    exciting the data acquisition device with said test signal pattern;
    obtaining a response of the data acquisition device to said signal pattern;
    weighting said response of the data acquisition device with a weighting coefficient;
    computing a frequency domain transform of said weighted response;

computing a frequency domain transform of said test signal pattern;

determining said frequency transfer function of the data acquisition device from a ratio of said frequency domain transfer of said weighted response to said frequency domain transform of said test signal pattern; and correcting the data acquisition device with said frequency transfer function.

5. The method of claim 4, further comprising the step of generating a bilevel test signal pattern from said complete orthogonal set of functions.

6. The method of claim 4, further comprising the steps of generating a plurality of said test signal patterns, and exciting the data acquisition device with said test signal patterns one pattern at a time.

7. The method of claim 6, further comprising the steps of summing each weighted response, computing the frequency domain transform of said sum of weighted responses, summing the test signal patterns, computing the frequency domain transform of said sum of test signal patterns, and wherein said frequency transfer function is determined from a ratio of said frequency domain transform of said sum of said weighted responses to said frequency domain transform of said sum of said test signal patterns.

8. The method of claim 7, further comprising the steps of providing said set of complete orthogonal functions as a set of rank N Walsh functions, where $N=2^m$, m a positive integer, inputing said test signal patterns generated by said functions to the data acquisition device in a continuous stream, each said pattern having a minimum switching period $\tau$, and a pattern period $T=N\tau$, and further summing of said weighted responses of the signal processing device to said patterns by summing a portion of each said response over a sampling period T, equal to said pattern period and forming a product of said portion of said response and said weighting coefficient.

9. A method for determining a frequency transfer function of a data acquisition device, and correcting the data acquisition device for the frequency transfer function, comprising the steps of:

providing a voltage source and switch system capable of generating a weighted set of rank N Walsh function patterns, where $N=2^m$, m a positive integer, each said pattern having a minimun switching period $\tau$, and a pattern period $T=N\tau$;

exciting the data acquisition device with selected individual Walsh function patterns in a concatenated stream;

obtaining a finite response of the data acquisition device to each said selected Walsh function pattern by sampling a portion of each said response over a sampling period T, equal to said pattern period;

weighting each said finite response with a weighting coefficient;

computing the sum of said Walsh function patterns;

computing the Fourier transform of said sum of said Walsh function patterns;

computing the sum of said weighted finite responses;

computing the Fourier transforms of said sum of said weighted finite responses;

determining said frequency transfer function of the data acquisition device from a ratio of said Fourier transform of said sum of said weighted finite responses to said Fourier transform to said sum of said Walsh function patterns; and correcting the data acquisition device with said frequency transfer function.

10. A method for determining a frequency transfer function of a data acquisition system, wherein a weighted test signal pattern representing a selected input function is applied to the system, the system's response obtained, and a ratio formed of a frequency domain transform of said response to a frequency domain transform of said weighted test signal pattern to determine said frequency transfer function, comprising the steps of:

generating a bilevel signal pattern;

generating weighting values corresponding to said selected input function; and generating said weighted test signal pattern as a product of said weighting values and said bilevel signal pattern.

11. The method of claim 10 further comprising the steps of generating a plurality of said test signal patterns, and applying said test signal patterns to the data acquisition system one pattern at a time.

12. The method of claim 11 further comprising the step of correcting the data acquisition system with said frequency transfer function.

13. A method for determining a frequency transfer function of a data acquisition system, wherein a test signal pattern representing a selected input function is applied to the system, the system's response obtained, and a ratio formed of a frequency domain transform of a weighted value of said response to a frequency domain transform of said test signal pattern to determine said frequency transfer function, comprising the steps of:

generating a bilevel signal pattern;

generating weighting values corresponding to said selected input function; and forming said weighted value of said response as a product of said weighting values and said system's response.

14. The method of claim 13, further comprising the steps of generating a plurality of said test signal patterns, and applying said test signal patterns to the data acquisition system one pattern at a time.

15. The method of claim 14, further comprising the step of correcting the data acquisition system with said frequency transfer function.

16. A method for correcting the response of a data acquisition device over a broadband frequency spectrum with bilevel input test patterns, comprising the steps of:

forming a set of k Nth-order Walsh patterns, $\Psi_k(t)$, where $N=2^m$, m a positive integer, whose vector sum, $\Psi(t)$, represents an approximation to a pulse function $\delta(t)$ of height N and width $\tau$, where $\tau$ is the minimum switching period of the set of patterns, $\Psi_k(t)$, $$\Psi(t) = \sum_{k=0}^{N-1} \psi_k(t) \simeq N\delta(t);$$

exciting the data acquistion device with each said pattern, $\Psi_k(t)$;

obtaining from the data acquisition device a response, $y_k(t)$, to each said pattern;

computing the Fourier Transform, $X_k(\omega)$, of the vector sum, $\Psi(t)$, of the patterns, $\Psi_k(t)$, $$X_k(\omega) = N \cdot \frac{\sin(\omega\tau/2)}{(\omega/2)} \cdot e^{-j\omega t/2};$$

weighting each said response $y_k(t)$ with a weighting coefficient, $a_k$;

forming a vector sum of said weighted responses, and computing the Fourier Transform, $Y_k(\omega)$, of said sum of said weighted responses, of the form $$Y_k(\omega) = \text{Fourier}\left\{\sum_{k=0}^{N-1} a_k y_k(t)\right\} = X_k(\omega) \cdot H(\omega);$$

computing the magnitude of a transfer function vector for the signal processing device, $$|H(\omega)| = \frac{|Y_k(\omega)|}{|X_k(\omega)|}; \text{ and}$$

correcting the response of the data acquisition device with the magnitude of said transfer function vector.

17. A device for generating a correction coefficients for a linear or nearly linear data acquisition device, comprising:
   means for generating a bilevel test signal pattern;
   means for inputting said bilevel test signal pattern generated by said bilevel signal pattern generating means to the data acquisition device;
   means for measuring response of the data acquisition device to said bilevel signal pattern; and
   means for calculating said correction coefficient from said response of the data acquisition device to said bilevel signal test pattern.

18. The device according to claim 17, further comprising means for weighting said response with a weighting coefficient prior to calculating said correction coefficient, and further comprising means for calculating said correction coefficient from said weighted response.

19. A calibration device for generating a correction coefficient for a linear or nearly linear data acquisition device, and for correcting the data acquisition device with said correction coefficient, comprising:
   means for generating a bilevel test signal pattern;
   means for inputting said bilevel test signal pattern generated by said bilevel signal pattern generating means to the data acquisition device;
   means for obtaining response of the data acquisition device to said bilevel signal pattern;
   means for weighting said response with a weighting coefficient;
   means for calculating said correction coefficients from said weighted response of the data acquisition device to said bilevel signal test pattern;
   a memory device for storing said correction coefficients; and
   correction means for correcting the data acquisition device with said stored correction coefficients.

20. The calibration device according to claim 19, wherein said means for generating a bilevel test signal pattern is a calibrated voltage source and switch means.

21. The calibration device according to claim 19, wherein said means for calculating said correction coefficients from said weighted response of the data acquisition device to said bilevel test signal pattern comprises an FFT device, arithmetic operator, and memory device capable of calculating said correction coefficients as a ratio of a Fourier transform of said weighted response of the data acquisition device to a Fourier transform of said bilevel test signal pattern.

22. A device for generating correction coefficients for a linear or nearly linear data acquisition device, and for correcting the data acquisition device with said correction coefficients, comprising:
   a calibrated voltage source and switch means capable of generating a complete set of Walsh function test signal patterns;
   means for inputting said test signal patterns to the data acquisition device one pattern at a time;
   means for obtaining a response of the data acquisition device to each said test signal pattern;
   means for weighting said response with a weighting coefficient;
   a summing device for summing said weighted responses to each said test signal pattern;
   an FFT device for calculating the Fourier transform of said sum of said weighted responses;
   a memory device for storing said Fourier transform of said sum of said weighted responses;
   a summing device for summing said test signal patterns;
   an FFT device for calculating the Fourier transform of the sum of said test signal patterns;
   an inverter for calculating the reciprocal of said Fourier transform of said sum of test signal patterns;
   a multiplier for multiplying said Fourier transforms of said sum of said weighted responses and said reciprocal of said Fourier transform of said sum of test signal patterns; and
   means for correcting the data acquisition device with the product obtained from said multiplier.

* * * * *